United States Patent [19]

White, Jr. et al.

[11] Patent Number: 5,316,803
[45] Date of Patent: May 31, 1994

[54] METHOD FOR FORMING ELECTRICAL INTERCONNECTIONS IN LAMINATED VIAS

[75] Inventors: Russell T. White, Jr., Conklin; Robert E. Ruane, Endicott, both of N.Y.

[73] Assignee: International Business Machines Corporation, Armonk, N.Y.

[21] Appl. No.: 988,850

[22] Filed: Dec. 10, 1992

[51] Int. Cl.⁵ ............................. B05D 3/06; B05D 5/12
[52] U.S. Cl. ............................. 427/554; 427/96; 427/98; 427/123; 427/124; 427/555; 29/885; 204/157.15; 361/794
[58] Field of Search .................. 427/98, 554, 123, 124, 427/96, 555; 29/885; 361/412, 414; 204/157.15

[56] References Cited

U.S. PATENT DOCUMENTS

| | | | |
|---|---|---|---|
| 3,718,968 | 3/1973 | Sims et al. | 29/482 |
| 3,844,799 | 10/1974 | Underkofler et al. | 106/126 |
| 3,930,304 | 1/1976 | Keller et al. | 29/574 |
| 4,152,467 | 5/1979 | Alpaugh et al. | 427/8 |
| 4,448,804 | 5/1984 | Amelio et al. | 427/98 |
| 4,478,883 | 10/1984 | Bupp et al. | 427/97 |
| 4,552,831 | 11/1985 | Liu | 427/596 |
| 4,554,182 | 11/1985 | Bupp et al. | 427/304 |
| 4,587,395 | 5/1986 | Oakley et al. | 219/121 LD |
| 4,639,380 | 1/1987 | Amelio et al. | 427/97 |
| 4,659,587 | 4/1987 | Imuki et al. | 427/35 |
| 4,673,592 | 6/1987 | Porter et al. | 427/554 |
| 4,681,774 | 7/1987 | Halliwell et al. | 427/98 |
| 4,711,822 | 12/1987 | Choyke et al. | 427/98 |
| 4,854,038 | 8/1989 | Wiley | 29/830 |
| 4,864,722 | 9/1989 | Lazzarini et al. | 29/830 |
| 4,865,873 | 12/1989 | Cole, Jr. et al. | 427/98 |
| 4,868,068 | 9/1989 | Yamaguchi et al. | 427/596 |
| 4,868,350 | 9/1989 | Hoffarth et al. | 174/68.5 |
| 4,893,167 | 1/1990 | Boudou et al. | 357/51 |
| 4,916,809 | 4/1990 | Boudou et al. | 427/97 |
| 4,960,613 | 10/1990 | Cole et al. | 427/53.1 |
| 5,055,342 | 10/1991 | Markovich et al. | 428/137 |
| 5,084,299 | 1/1992 | Hirsch et al. | 427/53.1 |
| 5,093,279 | 3/1992 | Andreshak et al. | 427/554 |
| 5,124,175 | 6/1992 | Miracky et al. | 427/596 |
| 5,127,986 | 7/1992 | August et al. | 427/98 |

FOREIGN PATENT DOCUMENTS

| | | | |
|---|---|---|---|
| 182379 | 5/1986 | European Pat. Off. | 427/454 |
| 0252814 | 1/1988 | European Pat. Off. | |
| 0297963 | 1/1989 | European Pat. Off. | |
| 469703 | 2/1992 | European Pat. Off. | 427/98 |
| 56-46583 | 4/1981 | Japan | |

Primary Examiner—Anthony Green
Attorney, Agent, or Firm—Pollock, Vande Sande & Priddy

[57] ABSTRACT

A method for forming electrical interconnections in vias is provided by laser drilling vias in a composite that contains at least two circuitized organic polymeric substrates superimposed upon each other. The laser drilling causes metallic circuit lines contained within each substrate to melt and form a fused mass protruding a short distance out of the side of the drilled vias. Next, the drilled vias are plated with a conductive metal to thereby provide the interconnections.

16 Claims, 2 Drawing Sheets

METHOD FOR FORMING ELECTRICAL INTERCONNECTIONS IN LAMINATED VIAS

TECHNICAL FIELD

The present invention is concerned with a method for forming electrical interconnections in laminated vias to thereby connect at least two circuitized organic polymeric substrates. In particular, the present invention is concerned with a process that employs laser drilling followed by plating in the drilled vias. The present invention overcomes problems concerned with the need to provide a ring land having relatively small etched center hole as well as the tendency of leaving a layer of residual dielectric after drilling, as experienced in the prior art.

BACKGROUND OF THE INVENTION

Generally speaking, high density printed circuit boards are constructed with several electrically conductive layers separated by dielectric layers. Some of the conductive layers are utilized to supply power and ground voltages. The remaining conductive layers are patterned for electrical signal interconnections among integrated circuit chips. Layer-to-layer interconnections are achieved by means of through-holes plated with electrically conductive material. In high density printed circuit boards, it has been normal practice to provide interconnections between adjacent conducting layers, which interconnections are commonly known as "vias".

Recently, there have been various suggestions of providing circuitized sub-composites which in turn are then assembled and laminated together to form the desired printed circuit board or card. For example, see U.S. Pat. Nos. 4,854,038; 4,864,722 and 4,868,350, all assigned to International Business Machines Corporation, the assignee of the present application, disclosures of which are incorporated herein by reference.

However, when employing laser technique to drill the interconnections, difficulties have been experienced in that it is necessary to provide a ring land having a relatively small etched center hole. In addition, in such arrangement, there is a tendency for the laser drilling to leave a residue of a thin layer of dielectrical material when drilling down to the buried layers of metal.

SUMMARY OF INVENTION

The present invention is concerned with a method for forming electrical interconnections in vias that eliminates the above problems experienced in the prior art. In particular, the present invention is concerned with a method for forming electrical interconnections in vias connecting at least two circuitized organic polymeric substrates. In particular, the process of the present invention includes providing a composite containing at least two circuitized organic polymeric substrates superimposed upon each other. Vias are then laser drilled into the substrates to thereby cause metallic circuit lines contained therein to melt and form a fused mass protruding a short distance out of the side of the drilled vias. Next, the drilled vias are plated with a conductive metal to thereby provide the desired electrical interconnections.

BEST AND VARIOUS MODES FOR CARRYING OUT INVENTION

Figure 1:
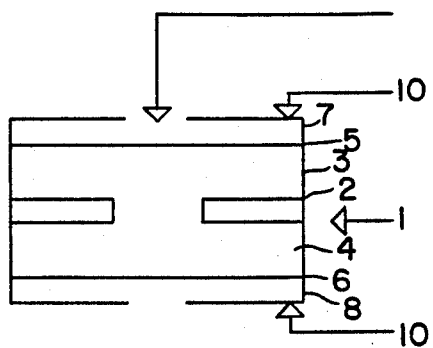
FIG. 1 is a schematic diagram of a composite that can be subjected to the process of the present invention.

Reference is made to the figures to facilitate an understanding of the present invention. FIG. 1 is a schematic diagram of a typical composite subjected to the process of the present invention. In particular, the composite 1 includes a power core of an electrically conductive material 2, preferably copper, electrically insulated by dielectric layers 3 and 4. The power core is typically copper or a composite of copper-Invar-copper. The power plane is typically about 0.0003 to about 0.0030 inches thick, and more typically, about 0.0010 to about 0.0015 inches thick. When copper is employed, it has been found to be advantageous to have the power plane material supplied with an adhesion-promoting treatment applied to both surfaces. Typically, copper is supplied with a special adhesion promoting surface on one side and a smooth surface on the other side. However, is the present case, the copper plane itself is a basic building block and employs dielectric bonding on both surfaces. Accordingly, the copper employed typically has been pretreated on both surfaces by mechanically roughening and chemical treatment to promote adhesion. Such pretreatments can be carried out by those skilled in the art without undue experimentation and need not be discussed in any detail. In fact such pretreated materials are available from various suppliers including Gould and Oak. In a typical copper-Invar-copper [CIC] power plane, the copper contacting the dielectric is likewise treated. In a typical arrangement, such is a sandwich of about 0.0005 to about 0.0030 inches thick, more typically about 0.0008 inches of Invar surrounded by copper layers of about 0.00009 to about 0.0002 inches thick, and more typically, about 0.0001 inches thick.

The dielectric layers 3 and 4 include both thermoplastic and thermosetting resins Typical thermosetting polymeric materials include epoxy, phenolic based materials, polyimides and polyamides. Examples of some phenolic type materials include copolymers of phenol, resorcinol and cresol. Examples of some suitable thermoplastic polymeric materials include polyolefins such as polypropylene, polysulfones, polycarbonates, nitrile rubbers, ABS polymers and fluorocarbon polymers such as polytetrafluoroethylene, polymers of chlorotrifluoroethylene, fluorinated ethylene propylene polymers, polyvinylidene fluoride and polyhexafluoropropylene. The dielectric materials may be molded articles of the polymers containing fillers and/or reinforcing agents such as glass filled polymers.

According to preferred aspects of the present invention, the dielectric layers 3 and 4 are obtained from polymeric materials having a dielectric constant (ER) of about 3.2 or less. Suitable materials which can be used include preferably fluorocarbon polymers such as for example polytetrafluoroethylene (PTFE), polychlorotrifluoroethylene (CTFE) and polyperfluoropropylene, optionally filled with a filler such as quartz or silicon particles and optionally reinforced with a fabric such as woven fluorocarbon fabric. Typical dielectric material is available from Rogers Corp. under the trade designation RO2810, which is polytetrafluoroethylene material filled with silica. Other exemplary materials include that obtained from Rogers Corp. under the trade designation RO2500 as well as unfilled polytetrafluoroethylene and polyimides such as Upilex.

Each dielectric layer 3 and 4 is typically about 0.002 inches to about 0.004 inches thick.

Laminated to the dielectric layers 3 and 4 are electrically conductive layers 5 and 6, respectively, which are to provide the desired signal planes The electrically conductive layers 5 and 6 are preferably copper and are about 0.0001 to about 0.0020 inches thick, and more typically about 0.0002 to about 0.0005 inches thick.

Typically this signal layer has been patterned, by conventional photolithographic and chemical etching processes, to discrete etched sign wires, each typically 0.001 to 0.010 inches wide, more typically 0.002 to 0.004 inches wide.

Adjacent each conductive layer 5 and 6 is a dielectric layer 7 and 8 which is preferably the same material as employed in layers 3 and 4. Each dielectric layer 7 and 8 is about 0.0010 to about 0.0040 inches thick, and more typically about 0.0020 to about 0.0025 inches thick.

The composite 1 can be fabricated by building it up in a series of steps. For instance, first the internal plane is personalized, usually through an etching process although mechanical drilling is also suitable. The personalization process provides the clearance areas in the continuous power plane for the signal vias which are added at the final stage. This personalization is required for either Copper or CIC power planes. Next, the power planes are formed into subcomposites through a lamination process. The lamination process used is typical of the dielectric material chosen. In the case of a polytetrafluoroethylene or polyamide material, the lamination process is similar to epoxy resin lamination except that higher temperatures are required. After the subcomposite is formed, the external surfaces are processed to form the desired circuit paths through any of the typical processes, e.g. a print and etch process for subtractive formation or an etch and plate process for additively made circuit paths. The choice of circuitization process used usually depends on the density and complexity of the pattern to be produced. High density patterns in relatively thin copper layers. (0.0001–0.0004 inches thick) can be made with a subtractive process. More complex and thicker patterns usually require a mask and plate (additive) process. After completion of the signal layers, the subcomposite is again laminated using a similar lamination process to form the final base unit. It is on this final unit that the laser drilled vias are formed.

Electrical interconnections between the electrically conductive layers must be made. This is typically done by means of through-holes plated with electrically conductive material. These interconnections are commonly referred to as "vias". Pursuant to the present invention, the interconnections are provided by first laser drilling through holes in the desired location into the substrates. The laser drilling is typically carried out employing a carbon dioxide laser, although other types of lasers (e.g. excimer, YAG) may also be used. The laser can have a pulsed or a continuous wave output, but preferably a pulsed output. Typically, the laser employs an energy of about 10 to 20 millijoules per pulse and a pulse rate of about 500 to 3000 Hertz. The beam is focused with a 5 inch ZnSe lens and the part being drilled is positioned about 0.20 inches below the focal point. The beam spot size on the surface of the mask is about 0.010 to 0.020 inches in diameter, more typically about 0.015 inches. The beam is scanned by employing suitable mechanical means, over the openings etched in the mask at about 0.5 to 5 inches per second, more typically about 1 inch per second. With this typical combination of laser pulse energy, pulse rate, laser focus, and scan speed the desired drilling action, as described below, occurs.

Figure 2:
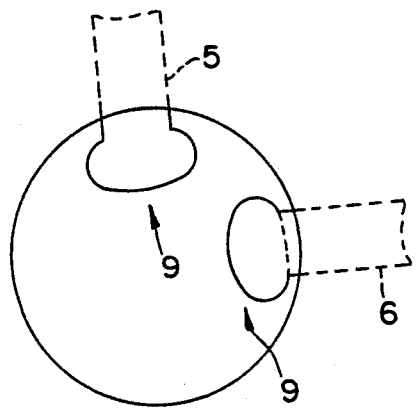
FIG. 2 is a top sectional view of a via drilled pursuant to the present invention.
Figure 3:
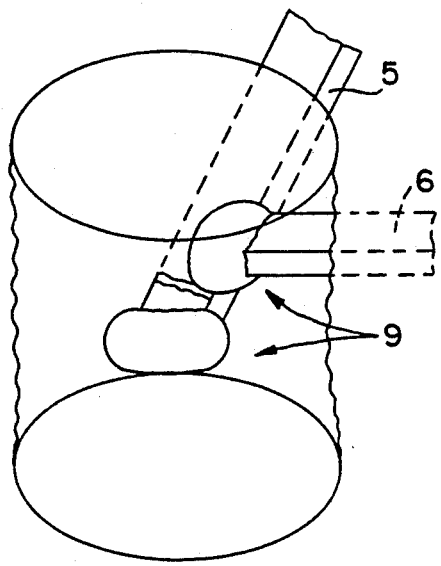
FIG. 3 is an isometric view of the via of FIG. 2.

The laser is directed to the predetermined desired locations by scanning the laser beam across holes in a metal mask 10 that is either positioned in close contact with the circuit board to be drilled, or is an integral part of the circuit board. In the integral case, the mask holes would most typically be etched, using conventional photolithographic and chemical etching processes into a copper foil layer that is laminated onto the circuit board as part of the normal fabrication process. This metal mask layer is typically made of copper or any other metal that has a high reflectivity to the laser being used. The laser parameters are set, as described above, such that it vaporizes the dielectric material in the beam path and then melts the electrically conductive circuit lines which, when melted, pull back to form a fused ball that will protrude a relatively short distance out of the side of the drilled hole, as illustrated in FIGS. 2 and 3. Typically, the mask holes, and the subsequent drilled holes are about 0.001 to 0.010 inches in diameter, more typically 0.002 to about 0.005 inches The length of the drilled hole is the thickness of the circuit board, typically 0.004 to 0.030 inches, more typically about 0.008 inches. The fused end(s) 9 of the circuit lines typically protrudes about 0.0005 to 0.002 inches, typically about 0.001 inches in toward the center of the hole from the hole walls. Depending upon the relative thickness of the composite, it may be necessary to carry out laser drilling from both sides of the composite.

Figure 4:
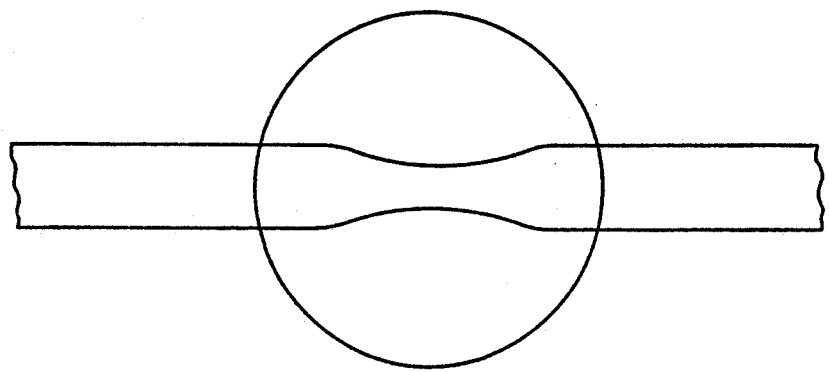
FIGS. 4 and 5 illustrate an alternative embodiment for conductive lines to be used pursuant to the present invention.
Figure 5:
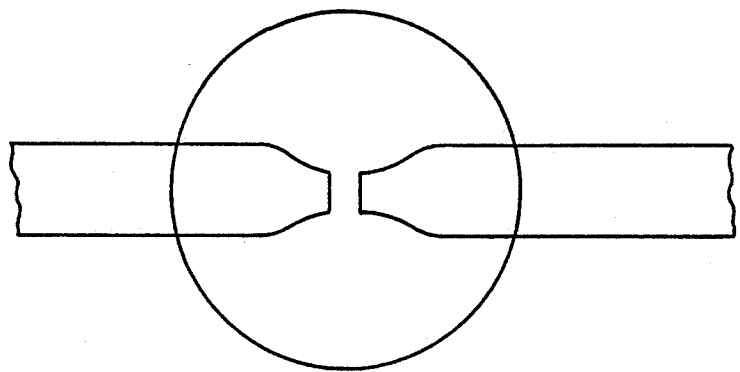

In addition, in order to facilitate the melting procedure, any or all of the electrically conductive layers can be configured so as to "neck" down at the location where the laser is to impinge (see FIG. 3). FIG. 4 illustrates the layer of FIG. 3 after the laser drilling.

Next, the vias are plated with an electrically conductive material to thereby provide the desired interconnections. This can be carried out either by an additive or subtractive type of plating process. Suitable additive electroless processes that can be employed as well as the pretreatment steps are disclosed in U.S. Pat. Nos. 4,448,804; 4,478,883; 4,554,182 and 4,639,380, the disclosures of which are incorporated herein by reference.

According to preferred aspects of the present invention, when the dielectric material is a fluorinated polymeric material, a pretreatment is preferably carried out pursuant to the process disclosed in U.S. patent application Ser. No. 07/584,327 to Bickford et al and assigned to the assignee of the present application, the entire disclosure of which is incorporated herein by reference. In particular, the walls of the vias are catalyzed for the subsequent plating thereon of a conductive metal by contacting with a reducing agent followed by contacting with an electroless plating bath and, in addition, if desired, prior to contacting with the electroless plating bath, a catalyst or seeding composition. Typical seeding composition include a solution of PdCl$_2$ in N-methylpyrrolodone.

Suitable metals for plating the vias include copper, nickel, gold, palladium, cobalt, silver, platinum, tin or mixtures thereof. The preferred metals are copper, nickel, cobalt and palladium. Suitable copper electroless plating baths and their method of application are disclosed in U.S. Pat. Nos. 3,844,799 and 4,152,467, the disclosures of which are incorporated herein by reference.

The copper electroless plating bath is generally an aqueous composition that includes a source of cupric ion, a reducing agent, a complexing agent for the cupric ion and a pH adjustor. Such also usually includes a cyanide ion source and a surface-active agent.

The cupric ion source generally used is cupric sulfate or a cupric salt of the complexing agent to be employed.

When employing cupric sulfate, it is usually employed in amounts of about 3 to about 15 grams/liter and more usually from about 8 to about 12 grams/liter. The most common reducing agent is formaldehyde which is generally used in amounts from about 0.7 to about 7 grams/liter and more usually about 0.7 to about 2.2 grams/liter.

An example of a suitable complexing agent is ethylenediaminetetraacetic and the sodium (mono-, di-, tri-, and tetra-) salts thereof.

The plating bath also usually contains a surfactant that assists in wetting the surface to be coated. A satisfactory surfactant is, for instance, an organic phosphate ester available under the trade designation GAFAC RE-610. Generally, the surfactant is present in amounts from about 0.02 to about 0.03 grams/liter.

Also, the pH of the bath is generally controlled, for instance, by the addition of a basic compound such as sodium hydroxide or potassium hydroxide in the desired amount to achieve the desired pH. The pH is usually between about 11.6 and 11.8.

The plating baths generally have a specific gravity within the range of 1.06 to 1.08. The temperature of the bath is usually maintained between 70° C. and 80° C. and more usually between 70° C. and 75° C. The O$_2$ content of the bath is generally contained between about 2 ppm and about 4 ppm and more usually about 2.5 ppm to about 3.5 ppm by injecting oxygen and an inert gas into the bath. The overall flow rate into the bath is usually from about 1 to about 20 SCFM per thousand gallons of bath.

What is claimed is:

1. A method for forming electrical interconnections in vias connecting at least two circuitized organic polymeric substrates which comprises:

(a) providing a composite containing at least two circuitized organic polymeric substrates superimposed upon each other; wherein said organic polymeric substrates contain dielectric material selected from the group consisting of thermoplastic resins and thermosetting resins;

(b) laser drilling vias into said substrates to thereby cause metallic circuit lines contained within each substrate to melt and form a fused mass protruding a short distance out of the side of the drilled vias; and (c) then plating said drilled vias with a conductive metal to thereby provide said interconnections.

2. The method of claim 1 wherein said composite includes at least one power core sandwiched between at least two signal planes.

3. The method of claim 1 wherein the dielectric material of the composite is a fluorocarbon polymer.

4. The method of claim 1 wherein the dielectric material of the composite is a polytetrafluoroethylene.

5. The method of claim 1 wherein the laser drilling employs a carbon dioxide laser.

6. The method of claim 1 which includes laser drilling from both sides of the composite.

7. The method of claim 1 wherein the fused mass protrudes about 0.0005 to about 0.002 inches out of the sides of the drilled vias.

8. The method of claim 1 wherein said circuit lines neck down at locations where the laser is to impinge during the drilling.

9. The method of claim 1 wherein said plating is electroless plating.

10. The method of claim 1 wherein said laser is an excimer laser.

11. The method claimed in claim 1 wherein said laser is a YAG laser.

12. The method of claim 1 wherein the dielectric material has a dielectric constant of about 3.2 or less.

13. The method of claim 1 wherein said dielectric material is a thermosetting polymeric material.

14. The method of claim 13 wherein said thermosetting polymeric material is selected from the group consisting of epoxy, phenolic based materials, polyimides and polyamides.

15. The method of claim 1 wherein said dielectric material is a thermoplastic polymeric material.

16. The method of claim 15 wherein said thermoplastic polymeric material is selected from the group consisting of polyolefins, polysulfones, polycarbonates, nitrile rubbers, ABS polymers and fluorocarbon polymers.

* * * * *